United States Patent [19]

Takano

[11] Patent Number: 4,824,800

[45] Date of Patent: Apr. 25, 1989

[54] METHOD OF FABRICATING SEMICONDUCTOR DEVICES

[75] Inventor: Hirozo Takano, Hyogo, Japan

[73] Assignee: Mitsubishi Denki Kabushiki Kaisha, Tokyo, Japan

[21] Appl. No.: 187,480

[22] Filed: Apr. 28, 1988

[30] Foreign Application Priority Data

May 8, 1987 [JP] Japan ................. 62-112911

[51] Int. Cl.⁴ .............. H01L 21/00; H01L 21/02; H01L 21/20; H01L 21/203
[52] U.S. Cl. ............................ 437/180; 437/944; 437/228; 437/229; 437/203; 148/DIG. 100
[58] Field of Search ............... 437/944, 228, 229, 180, 437/203; 148/DIG. 100

[56] References Cited

U.S. PATENT DOCUMENTS 4,040,168  8/1977  Huang .................... 437/80
4,497,684  2/1985  Sebesta ................... 437/173

FOREIGN PATENT DOCUMENTS 0138875  10/1980  Japan.
0061169   5/1981  Japan.
0067274   4/1986  Japan.

Primary Examiner—Brian E. Hearn
Assistant Examiner—B. Everhart
Attorney, Agent, or Firm—Leydig, Voit & Mayer

[57] ABSTRACT

An improved method of lift-off processing semiconductor devices including ohmic electrodes, gate electrodes, metal wiring, and the like. The invention provides for the production of an access groove pattern in the surface of the substrate prior to the application of the resist by photolithography and the deposition of metallization. The access groove pattern increases the opportunity for the chemical stripper to dissolve the resist and lift away the unrequired portions of the metallization, thus improving the reliability of the lift-off.

8 Claims, 4 Drawing Sheets

METHOD OF FABRICATING SEMICONDUCTOR DEVICES

FIELD OF THE INVENTION

The present invention relates generally to semiconductor devices and more particularly concerns methods for manufacturing semiconductor devices.

BACKGROUND OF THE INVENTION

Integrated circuits have become increasingly important in recent years through increased usage and expanded product applications. Chemical compound semiconductor devices, such as gallium arsenide (GaAs) integrated circuits are widely used in microwave circuits, communication satellite systems, and information network systems. This popularity is due, in part, to the fact that GaAs integrated circuits exhibit outstanding high-speed properties and high-frequency characteristics. Multiple microelectronic devices, usually including gate electrodes and ohmic electrodes, are created on the surface of a single wafer or substrate by the successive application of various fabrication techniques. When a device utilizes a GaAs crystal substrate, usually gold or gold alloys are used in metallization, and the device is patterned using a lift-off technique. This is generally a three-part process during which a photoresist is produced, one or more layers of film or metallization are deposited, and finally the resist is stripped off by a wet chemical stripper, lifting off the unrequired portions of the metallization.

During fabrication, the resist mask produces a steep profile. As a result, the film or metallization deposited may overhang the underlying resist, but ideally, the deposited film does not completely cover the edges of the resist steps. This failure of step coverage in the overhanging profile provides an opportunity for the wet chemical stripper, such as an organic solvent, to invade the gaps in the metallization and the resist to dissolve the resist and lift away the overlying metal plating. If the deposited plating completely covers the end of the resist, or the photoresist coverage at the main surface of the substrate is incomplete, there may be inadequate opportunity for the chemical stripper to dissolve the resist. As a result, portions of the plating may remain on the surface of the substrate. If the photoresist pattern is not completely removed at this time, it may contaminate diffusion or deposition furnaces. Additionally, these partially detached metallic remains may cause variations in the thickness of the photoresist film in subsequent photoresist plating processes. Further, inconsistent photoresist lift-off often produces defective circuits, thereby reducing yield.

OBJECTS AND SUMMARY OF THE INVENTION

It is a primary aim of this invention to provide an improved and more reliable method of producing semiconductor devices which incorporates ohmic electrodes, gate electrodes, metal wiring or the like. It is a more specific object to provide a more reliable method of lift-off in the production of semiconductor chips, such as monolithic microwave integrated circuits (MMIC) or field-effect transistors (FET).

An additional object is to provide a system whereby a large number of identical devices may be created simultaneously by a reliable method with high reproducibility. Related objects are to improve yield and thereby increase the economics of the fabrication process.

Another object is to provide a simple method of increasing photoresist lift-off reliability while utilizing little semiconductor surface area.

In accomplishing those objectives in accordance with the invention, there is provided a method by which the photoresist and unrequired portions of the metallic plating may be reliably removed from the substrate by a wet chemical stripper during production of microelectronic devices. More particularly, prior to photoresist masking, a groove of specified depth is formed in the surface of the wafer or semiconductor chip. Thereafter, a microelectronic device pattern is produced on a substrate by a lift-off method according to conventional processing technology. During the lift-off process, the grooves provide additional opportunity for the introduction of the chemical stripper to invade and dissolve the resist and lift the unrequired portions of the photoresist and the overlying plating to prevent inconsistent lift-off.

These and other features and advantages of the invention will be more readily apparent upon reading the following description of certain preferred embodiments of the invention and upon reference to the accompanying drawings wherein:

While the invention will be described and disclosed in connection with certain preferred embodiments and procedures, it is not intended to limit the invention to those specific embodiments. Rather it is intended to cover all such alternative embodiments and modifications as fall within the spirit and scope of the invention as defined by the appended claims.

DETAILED DESCRIPTION OF THE PREFERRED EMBODIMENTS

Turning now to the drawings, FIGS. 1(a)-(e) show enlarged cross sectional views of a portion of a semiconductor device such as a gallium arsenide field effect transistor (GaAs FET) produced by the lift-off method according to well known processing techniques. While the prior art and the invention are described in connection with a semi-insulative GaAs substrate, it will be appreciated that the invention may likewise be utilized with a silicon substrate to improve the reliability of the lift-off method of processing. The GaAs FET is produced on a single wafer 9 of substrate 10. The FET may be one of a number of semiconductor devices produced on the wafer which may later be cut into individual devices. Alternately, the FET may be produced as one of the elements of a monolithic microwave integrated circuit (MMIC), a plurality of which can be fabricated on a single wafer.

Figure 1:
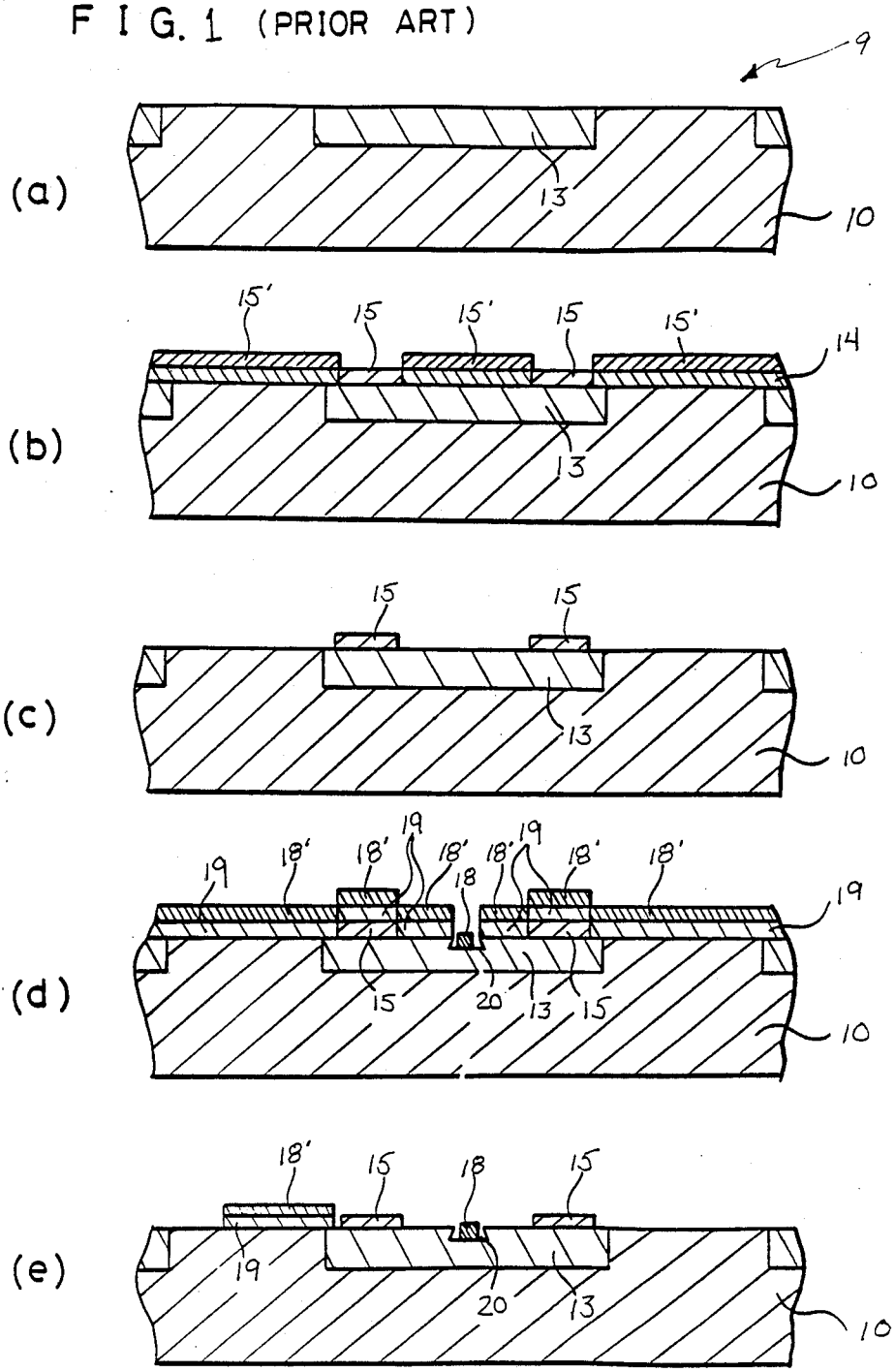
FIG. 1 is an enlarged, fragmentary view of a profile of a cross section of a microelectronic device for a processing sequence according to the prior art.

In fabricating the FET, a heavy n-type impurity such a silicon (Si) is diffused in to the main surface of the semi-insulated GaAs substrate 10 to produce an n-type conductivity layer 13, as shown in FIG. 1(a). A photoresist mask 14 is produced on the surface by way of photolithography. As shown in FIG. 1(b), a photoresist is applied to the surface and photolithographed to produce the resist mask 14 which exposes only those areas of the surface where subsequent metallization is required. Next, an ohmic electrode metal 15, 15' is vapor-plated over the entire surface. The ohmic electrode metal 15, 15' layer may include several layers of metallization such as germanium-gold alloy, nickel, and gold. After metal deposition, the portions of the ohmic electrode metal 15' overlying the photoresist 14 are removed by a conventional lift-off method. A wet chemical stripper or organic solvent is introduced to invade and dissolve the resist 14 and strip off the overlying metal 15', leaving the ohmic electrodes 15 as shown in FIG. 1(c). A gate electrode 18 is produced in the surface, in a similar manner. As shown in FIG. 1(d), a photoresist film 19 pattern is produced on the surface, exposing only the region of the surface where the gate electrode 18 is to be formed. Thereafter, the gate region is etched to open a recessed aperture 20 of desired depth. A gate electrode metal 18, 18' such as titanium-palladium-gold, titanium, molybdenum, or tungsten is vapor-plated on the surface. Subsequently, the photoresist film 19 and the overlying portions of the gate electrode metal 18' are removed by the previously described lift-off technique to produce a gate electrode 18, as shown in FIG. 1(e).

During processing, if the solvent does not have adequate opportunity to invade the photoresist 14, 19 and strip off the overlying metal 15', 18' metal residuals 15', 18' may remain attached to the surface of the wafer 9. As shown in FIG. 1(e), these resulting metal residuals 18' may cause variation in the surface of the wafer 9 and interfere with subsequent fabrication operations. Indeed, the residuals may often be so disposed as to cause circuit failure, thereby reducing the yield and detrimentally affecting the economics of the process.

Figure 2:
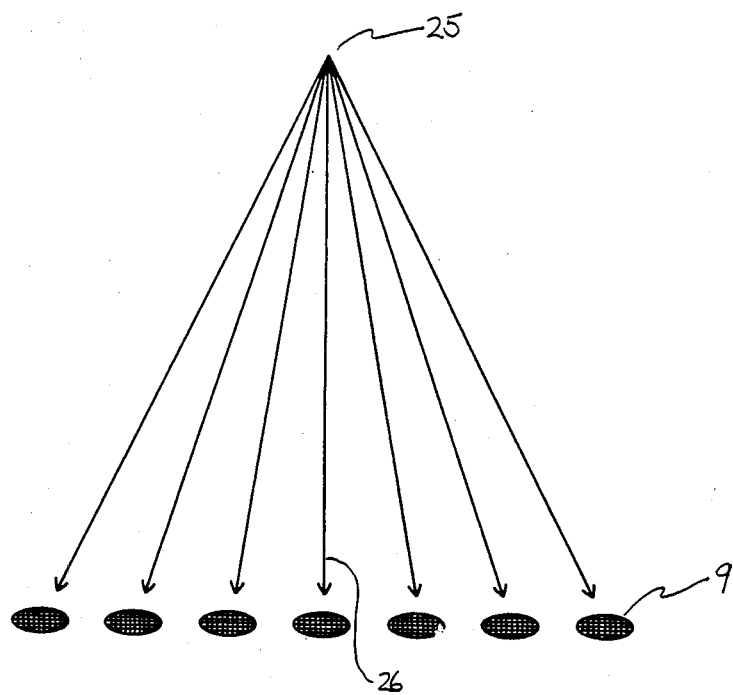
FIG. 2 is a schematic of a sputtering furnace showing a point source of metal to be plated and wafers located around the periphery of the chamber.
Figure 3:
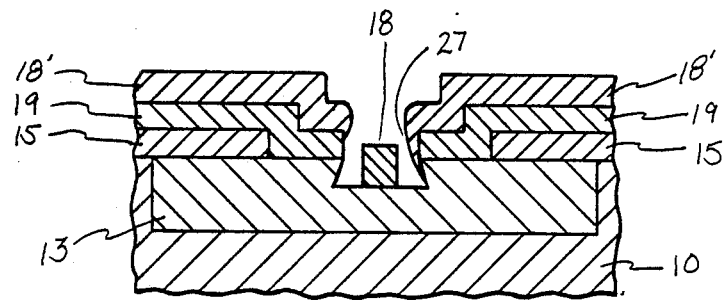
FIG. 3 shows an enlarged schematic profile view of the cross section through the substrate illustrating the irregular overhang profile of the photoresist.

FIG. 2 illustrates one possible source of the unreliable lift-off problem. In the production of semiconductor devices, the source of metal to be plated may be considered a point source in a sputtering furnace with the wafers being located around the periphery of the chamber as illustrated in FIG. 2. In this way, the angle of incidence varies across the furnace. Consequently, the source 25 irradiates some wafers 9 at a right angle, as indicated by the arrow 26 in FIG. 2, while other wafers 9 are irradiated at such an angle that the metal deposit 18, 18' may overhang the edge of the photoresist 19, as shown at 27 in FIG. 3. As a result, this overhanging metal 27 may prevent the solvent from intruding into the photoresist, resulting in unsatisfactory lift-off of the photoresist 19 and the overlying plating 18', as shown in FIG. 1(e).

Figure 4:
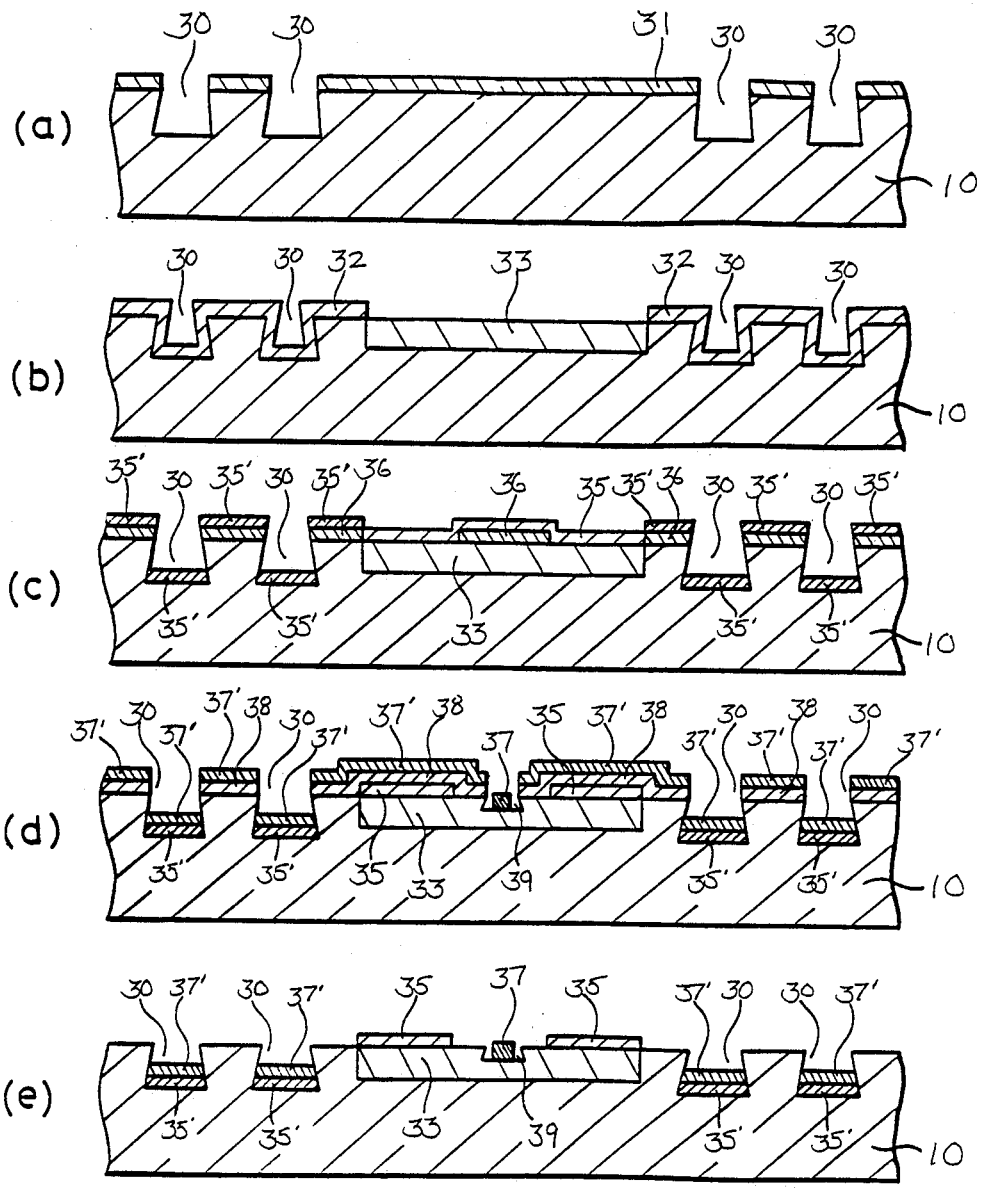
FIG. 4 is an enlarged fragmentary view of a cross section of a microelectronic device for a processing sequence according to the instant invention.

In accordance with the present invention, means are provided for assuring that unnecessary metal is completely removed during the lift-off process. In FIG. 4, those means are shown as a pattern of access grooves formed in the surface of the substrate prior to the formation of electrodes by the selective plating lift-off procedure. Electrodes are subsequently formed on the substrate by the selective production of a photoresist pattern, plating an electrode material over the pattern, and finally applying a solvent to the plated device to lift off the photoresist and the overlying plating. Having been formed of a sufficient depth to allow the solvent to access the photoresist underlying the plating, the access grooves assure that there are sufficient photoresist exposed edges to facilitate the intrusion of the solvent into the photoresist and assure the removal of the photoresist.

Referring more closely to FIG. 4, which shows an enlarged view of the cross section of a portion of a semiconductor device, in order to facilitate the removal of the photoresist, there is provided a pattern of access grooves 30 formed in the substrate 10 in a particular association with the semiconductor device. These grooves 30 are sufficiently deep so that during the lift-off process, the solvent will have improved access to the exposed edges of the photoresist underlying the plating to be removed. In a preferred embodiment of the invention, these grooves 30 are of a depth in the range of about 1 micron to about 5 microns and a width in the range of about 2 microns to about 5 microns.

As will be appreciated, FIGS. 4(a)–(e) illustrate the process sequence for the production of the semiconductor device according to the instant invention. In order to define the positions of the access grooves 30 in the substrate 10, a photoresist mask 31 is first produced on a surface of the substrate 10. Grooves 30 of desired depth are then formed in the surface of the substrate 10 in the unmasked portions. The photoresist mask 31 is then removed by means of a solvent.

Thereafter, a photoresist film is deposited on the surface and is then photolithographed to produce the photoresist film 32. In order to produce an n-type conductivity layer 33, n-type impurities such as silicon (Si) are ion injected using the photoresist 32 as a mask (FIG. 4(b)). The photoresist mask 32 is then removed.

To define the positions for the plating of ohmic electrodes 35, a photoresist is plated and photolithographed to produce photoresist film 36 as shown in FIG. 4(c). The ohmic electrode metal 35, 35' is then vapor plated using the photoresist film 36 as a mask. Thereafter, a solvent is applied to the device 9 to lift off the photoresist 36 and the overlying plating 35', leaving the ohmic electrode 35. One skilled in the art will now appreciate that the grooves 30 provide a mechanism by which the solvent may intrude into the underlying photoresist 36 to completely remove the overlying plating 35', thus improving reliability of the lift-off procedure. It will be noted that although some unnecessary portions of the ohmic electrode metal 35' remain in the main access grooves 30 after the photoresist film 36 has been stripped, the access grooves 30 are sufficiently deep so that the remaining metal 35' will not inhibit further plating and lift-off operations or functioning of the finished semiconductor device.

In order to define the position of the electrode gate 37, a photoresist is deposited on the surface and photolithographed to produce the photoresist film 38. In order to produce a recessed aperture 39 of desired depth, the n-type conductivity layer 33 is then etched using the photoresist film 38 as a mask. Thereafter, a gate electrode metal 37, 37' is vapor plated onto the surface. The photoresist 38 and overlying electrode metal 37' are subsequently removed by the lift-off procedure to produce the desired gate electrode 37. Once again, it may be noted that unnecessary remains of gate electrode metal 37' may remain in the access grooves 30 following lift-off without inhibiting future lift-off processes or the function of the finished semiconductor device. It will be appreciated that the device 9 may undergo further processes such as the attachment of metal wiring.

Figure 5:
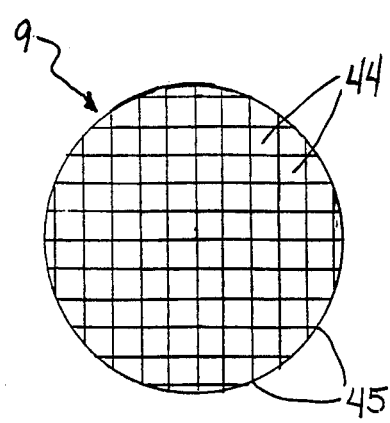
FIG. 5 is a plan view of a substrate wafer upon which individual semiconductor devices are formed.

As shown in FIG. 5, a number of semiconductor devices 44, such as FETs on MMICs, are typically, produced on a single wafer 9 of substrate 10. To assist in the lift-off process, the pattern of access grooves 30 may be formed in a discontinuous pattern on the substrate 10, or around the entire periphery of each individual device 44. After processing the wafer 9, the semiconductor devices 44 are cut along scribe lines 45 to yield individual devices 44.

Figure 6:
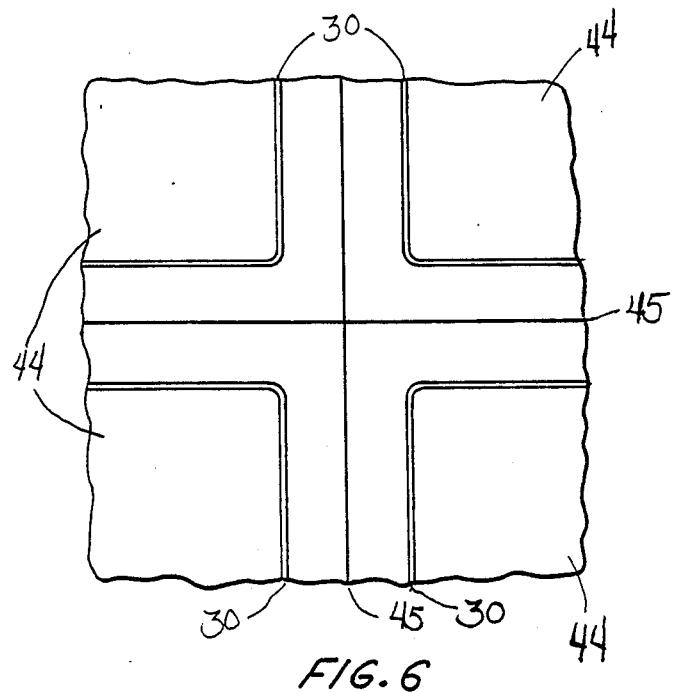
FIG. 6 is an enlarged fragmentary view of the scribe lines and the pattern of access grooves in a segment of the substrate wafer shown in FIG. 5.

FIG. 6 shows an enlarged view of a portion of the substrate wafer 9 of FIG. 5. In order to efficiently utilize the surface area of the wafer 9, the access grooves 30 may be formed adjacent to the scribe lines 45 between the individual devices 44. Indeed, the access groove 30 may function as the scribe line in certain circumstances. In this way, the invention uses a minimum of the surface area of the wafer 9, while greatly increasing the efficiency of processing.

Figure 7:
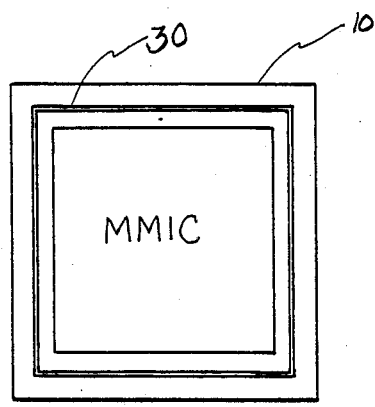
FIG. 7 is a plan view of a pattern of access grooves surrounding a monolithic microwave integrated circuit.
Figure 8:
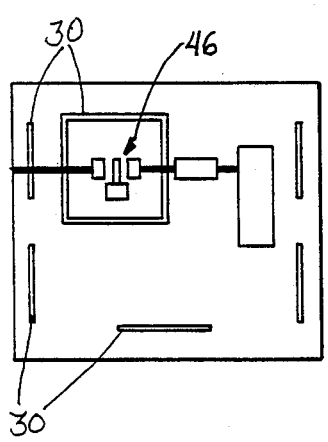
FIG. 8 is a detailed plan view of a pattern of access grooves formed in the surface of a monolithic microwave integrated circuit.

As shown in greater detail in FIG. 7, the pattern of access grooves 30 may extend around the periphery of each individual circuit, such as the illustrated MMIC or a discrete FET. Such a framing arrangement is usually adequate to facilitate lift-off in particular embodiments of the invention. An MMIC is normally on the order of two or three millimeters per side. Generally, a groove pattern that substantially surrounds the MMIC as illustrated will provide sufficient opportunity for the solvent to intrude into the photoresist to assure adequate lift-off. However, in some cases a tighter pattern of access grooves 30 may be needed to assure adequate lift-off. For example, FIG. 8 illustrates a groove pattern formed to surround one or more components such as the individual active component, i.e. FET 46, on the surface of the substrate. In this way, the pattern of access grooves 30 in the surface of the MMIC will asure adequate opportunity for the solvent to intrude into the photoresist film to provide reliable lift-off.

It will also be appreciated that the groove pattern 30 may be continuous as shown in FIG. 7, or discontinuous as shown in FIG. 8, or any useful combination of continuous and discontinuous grooves.

When the groove pattern is formed to intrude within an MMIC as shown in FIG. 8, in order to restore the planar board surface to facilitate application of later traces, a spin on glass (SOG) film (a solution of silicon dioxide ($SiO_2$) in a binder) may be used to fill grooves 30 and provide a coating on the top surface of the wafer 9 after the grooves 30 have served their purpose. The SOG film may then be etched away until the filled grooves are level with the surface of the board. The film is baked to yield a solid filler and present a planar board surface over which semiconductor traces may be laid.

The pattern of access grooves 30 of the instant invention may be utilized in a number of applications. As previously noted, although the invention is described in reference to a GaAs substrate, the inventive method would be equally effective where the semiconductor device utilizes a silicon substrate. Further, the invention may likewise be utilized in the production of semiconductor lasers or solar cells employing a compound semiconductor substrate.

In summary, the invention provides an improved method of producing semiconductor devices by a lift-off method. A pattern of grooves is formed in the surface of the semiconductor substrate. Thereafter, a photoresist pattern is produced and an electrode material is plated over the surface. A solvent is then applied to the device to lift off the photo resist ad overlying plating. In this way, the access grooves allow the solvent to access the exposed edges of the photoresist underlying the plating to improve lift-off efficiency and prevent metal residuals from remaining on the semiconductor surface. The grooves of the invention are formed sufficiently deep in the substrate surface so that layers of metallization may remain in the grooves after the plating process without inhibiting solvent access to the exposed edges provided by the grooves.

I claim as my invention:

1. A method of fabricating a semiconductor device on a substrate which includes formation of electrodes by selective plating using a liftoff procedure, the method comprising the steps of:
    forming a pattern of access grooves in the substrate associated with the semiconductor device in such a way as to assist in the lift-off of photoresist,
    producing a photoresist pattern on a partly fabricated semiconductor device having open areas for defining electrode positions and photoresist covered areas protecting the remaining surface of the semiconductor device,
    plating electrode material over the semiconductor device, and
    applying solvent to the plated semiconductor device to invade the photoresist at the exposed edges and lift off the photoresist and the overlying plating, the access grooves being of a depth sufficient to provide exposed edges to allow access by the solvent to the photoresist underlying the plating to assure lift-off.

2. A method of producing a semiconductor device as claimed in claim 1, wherein the depth of the access grooves is in the range of about 1 micron to about 5 microns, and the width of the access grooves is in the range of about 2 microns to about 5 microns.

3. A method of producing a semiconductor device as claimed in claim 1, wherein the semiconductor device is a field effect transistor, said access groove pattern framing the field effect transistor.

4. A method of producing a semiconductor device as claimed in claim 1, wherein the semiconductor device is a monolithic microwave integrated circuit, said access groove pattern framing the monolithic microwave integrated circuit.

5. A method of producing a semiconductor device as claimed in claim 4, wherein the access groove pattern is discontinuous around the periphery of the monolithic microwave integrated circuit.

6. A method of producing a semiconductor device as claimed in claim 4, wherein the access groove pattern is substantially continuous around the periphery of the monolithic microwave integrated circuit.

7. A method of producing a semiconductor device as claimed in claim 1, wherein the semiconductor device is a monolithic microwave integrated circuit, said access groove pattern framing (a) the monolithic microwave integrated circuit, and (b) at least one active device within the monolithic microwave integrated circuit.

8. A method of producing a semiconductor device as claimed in claim 1, wherein the substrate is a wafer for plural semiconductor devices, said wafer having scribe lines on the surface for separating individual semiconductor devices, and said access grooves being positioned near the scribe lines.

* * * * *